United States Patent [19]
Chaskell

[11] Patent Number: 6,008,654
[45] Date of Patent: Dec. 28, 1999

[54] METHOD AND APPARATUS FOR TESTING LINES IN A TELECOMMUNICATIONS NETWORK

[75] Inventor: Andrew D. Chaskell, Ipswich, United Kingdom

[73] Assignee: British Telecommunications public limited company, London, United Kingdom

[21] Appl. No.: 08/817,071

[22] PCT Filed: Nov. 30, 1995

[86] PCT No.: PCT/GB95/02802

§ 371 Date: Apr. 4, 1997

§ 102(e) Date: Apr. 4, 1997

[87] PCT Pub. No.: WO96/19072

PCT Pub. Date: Jun. 20, 1996

[30] Foreign Application Priority Data

Dec. 15, 1994 [GB] United Kingdom ............... 94309390

[51] Int. Cl.[6] ........................................ G01R 31/02
[52] U.S. Cl. ................................ 324/519; 324/522
[58] Field of Search ............................ 324/519, 541, 324/544, 551, 678

[56] References Cited

U.S. PATENT DOCUMENTS

| | | | |
|---|---|---|---|
| 3,973,187 | 8/1976 | Cereijo | 324/544 |
| 4,103,225 | 7/1978 | Stephens | 324/519 |
| 4,361,799 | 11/1982 | Lutz. | |
| 4,506,338 | 3/1985 | Danno. | |
| 4,721,916 | 1/1988 | Hanasawa | 324/544 |
| 4,820,991 | 4/1989 | Clark. | |
| 4,829,284 | 5/1989 | Pfaff. | |
| 5,060,226 | 10/1991 | Gewin et al.. | |
| 5,446,392 | 8/1995 | Inoue | 324/519 |
| 5,475,371 | 12/1995 | Dunk | 324/522 |

FOREIGN PATENT DOCUMENTS

| | | |
|---|---|---|
| 1162427 | 7/1978 | Germany. |
| 3245976 | 6/1983 | Germany. |
| 2180073 | 3/1987 | United Kingdom. |

OTHER PUBLICATIONS

Globecom 85—IEEE Global Conference, Dec. 1985.

*Primary Examiner*—Maura Regan
*Attorney, Agent, or Firm*—Nixon & Vanderhye P.C.

[57] ABSTRACT

The invention provides a method and apparatus for testing a telecommunications network between timed intervals to detect a fault in order to determine an approximate location of a fault. The method comprises measuring a change in capacitance of a line in the network and then determining from a known ratio of capacitance to length of line, a length of line that corresponds to that change. This length will give an approximate location of a fault from a subscriber's equipment located at premises remote from the measuring apparatus.

4 Claims, 3 Drawing Sheets

METHOD AND APPARATUS FOR TESTING LINES IN A TELECOMMUNICATIONS NETWORK

BACKGROUND OF THE INVENTION

1. Field of the Invention

This invention relates to a method and apparatus for testing a telecommunications network.

2. Related Art

When describing a public telecommunications network it is usual to subdivide the network into two parts a first part being a core network and the other part being an access network. The access network is that part of the network which extends from a subscriber's equipment to a local telephony exchange. The access network includes telephone poles, drop wires, cables, junction boxes, primary cross connection points and secondary cross-connection points which are familiar features of the urban and rural landscapes. These are the components which are most exposed to the elements and a large number of faults can occur in this part of the network as a consequence. The core network includes the local and trunk exchanges.

U.S. Pat. No. 4,103,225 describes an apparatus for measuring the capacitance of a telephone cable in order to determine the distance of an open circuit fault from a measurement point.

In the past network operators have relied upon subscribers to report faults. This may take place some time after the fault has occurred because some subscribers only use their equipment infrequently.

SUMMARY OF THE INVENTION

According to one aspect of the invention there is provided a method of testing a method of testing a telecommunications network for the presence of a fault, said method comprising the steps of:

determining a first capacitance value of a line of the network at a first time;

storing the first capacitance value;

determining a second capacitance value of the line at a second time;

determining from the first and second capacitance values a value for a change in capacitance value;

comparing the change in capacitance value with a threshold value so as to detect the present of a fault; and if the threshold value is exceeded, determining from the change in capacitance value and a known capacitance length ratio a corresponding length of line and hence the distance of the fault from terminating equipment at the end of the line remote from the point of measuring the capacitance values.

The corresponding length of line will be a change in length of that part of the line which is operational. This change in length will be due to a fault occurring between the subscriber's equipment and the exchange. The fault may be caused by an increase in series resistance in the line due, for example, to corrosion, or the fault may be due to a break or disconnection in the line. Such faults have the effect of cutting-off the subscribers equipment. Where the series resistance increases gradually, the quality of transmission over the line will deteriorate gradually until the equipment is effectively cut-off. In the case of a break or disconnection, the cut-off will be immediate. The change in length will be indicative of the location of the fault. The fault will be located by determining a position along the line from the subscriber's equipment equal to the determined change in length of line.

By monitoring the line in this way it is possible to detect and rectify faults before a subscriber discovers a fault exists. This greatly enhances the subscriber's perceived view of the service.

According to another aspect of the invention, there is provided an apparatus for testing at least one line of a telecommunications network for the presence of a fault, said apparatus comprising:

means for measuring the capacitance value of a line of the network at a first time to obtain a first capacitance value;

means for measuring the capacitance value of said line at a second time to obtain a second value;

means for determining a change in capacitance value from the first and second capacitance values;

mean for comparing said change in capacitance value with a threshold value so as to detect a fault; and means for determining from the change in capacitance value and a known capacitance length ratio a corresponding length of line and hence the distance of the fault from terminating equipment at the end of the line remote from the point of measuring the capacitance values.

BRIEF DESCRIPTION OF THE DRAWINGS

A specific embodiment of the invention will now be described, by way of example only, with reference to the drawings in which.

DETAILED DESCRIPTION OF EXEMPLARY EMBODIMENTS

Figure 1:
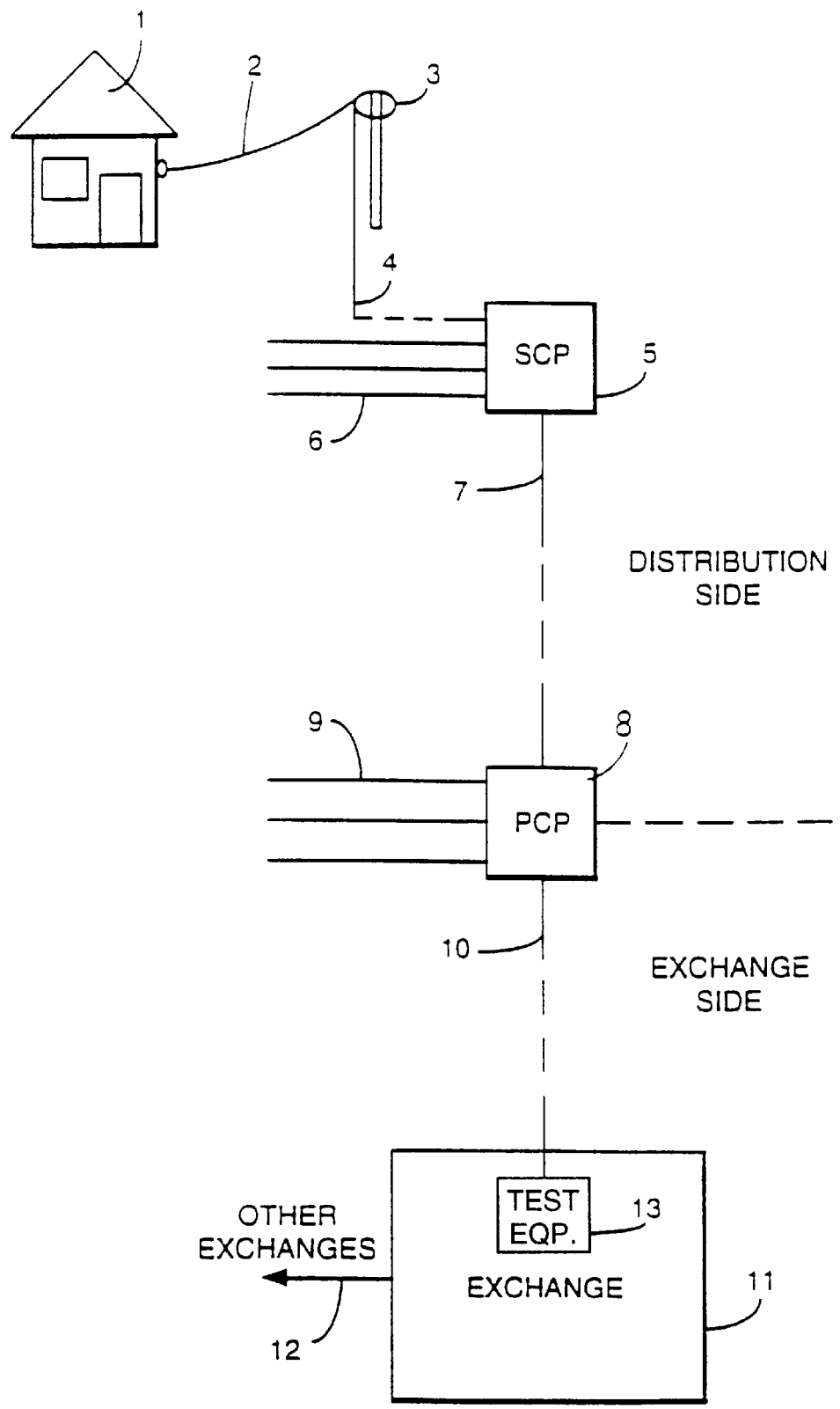
FIG. 1 shows in schematic form part of a telecommunications network from a local exchange to a subscriber's premises, the exchange including testing equipment in accordance with the invention.

Part of a public telecommunications network is shown in FIG. 1 and it comprises a subscriber's network terminating equipment located at a subscriber's premises 1, a drop wire 2 connected between the subscriber's equipment and a pole mounted distribution point (DP) 3, a cable 4 extending from the DP 3 to a secondary cross connection point (SCP) 5, further cables generally indicated at 6 extending from other DPs (not shown) to the SCP 5, a cable 7 extending from the SCP 5 to a primary cross connection point 8, further cables generally indicated at 9 extending from other SCPs not shown and the PCP 8, a cable 10 extending from the PCP 8 to a local area exchange 11, a trunk cable 12 linking the local area exchange 11 to other exchanges (not shown), and test equipment 13 located in the exchange 11. The part of the network between customers' equipment and the local exchange is known as the access network.

The drop wire 2 comprises a pair of copper wires held parallel and apart by an insulating sheath. The individual wires are called "legs". There is an A leg and a B leg. The DP 3 usually serves up to eight or so houses.

The wire pairs continue from the DP 3 as part of the cable 4. Thus the cable 4 could include eight or more wire pairs plus a further eight or more spare pairs making a total of typically twenty wire pairs. Similarly, each of the other cables 6 could include twenty wire pairs.

In a similar way, the cable 7 will carry about eighty wire pairs and cable 10 about two hundred and forty wire pairs.

The PCP 8 and the SCP 5 are in effect junction boxes which are usually in the form of streetside cabinets or posts.

The access network may be conveniently split into two parts. An exchange side which is that part of the network situated between the PCP 8 and the exchange 11 and a distribution side which is that part of the network between the PCP 8 and the subscribers' network terminating equipment. The exchange side may extend for many kilometres. Thus the cable 10 may be many kilometres long. The distribution side is normally less than this distance say about one or two kilometres in length.

Figure 2:
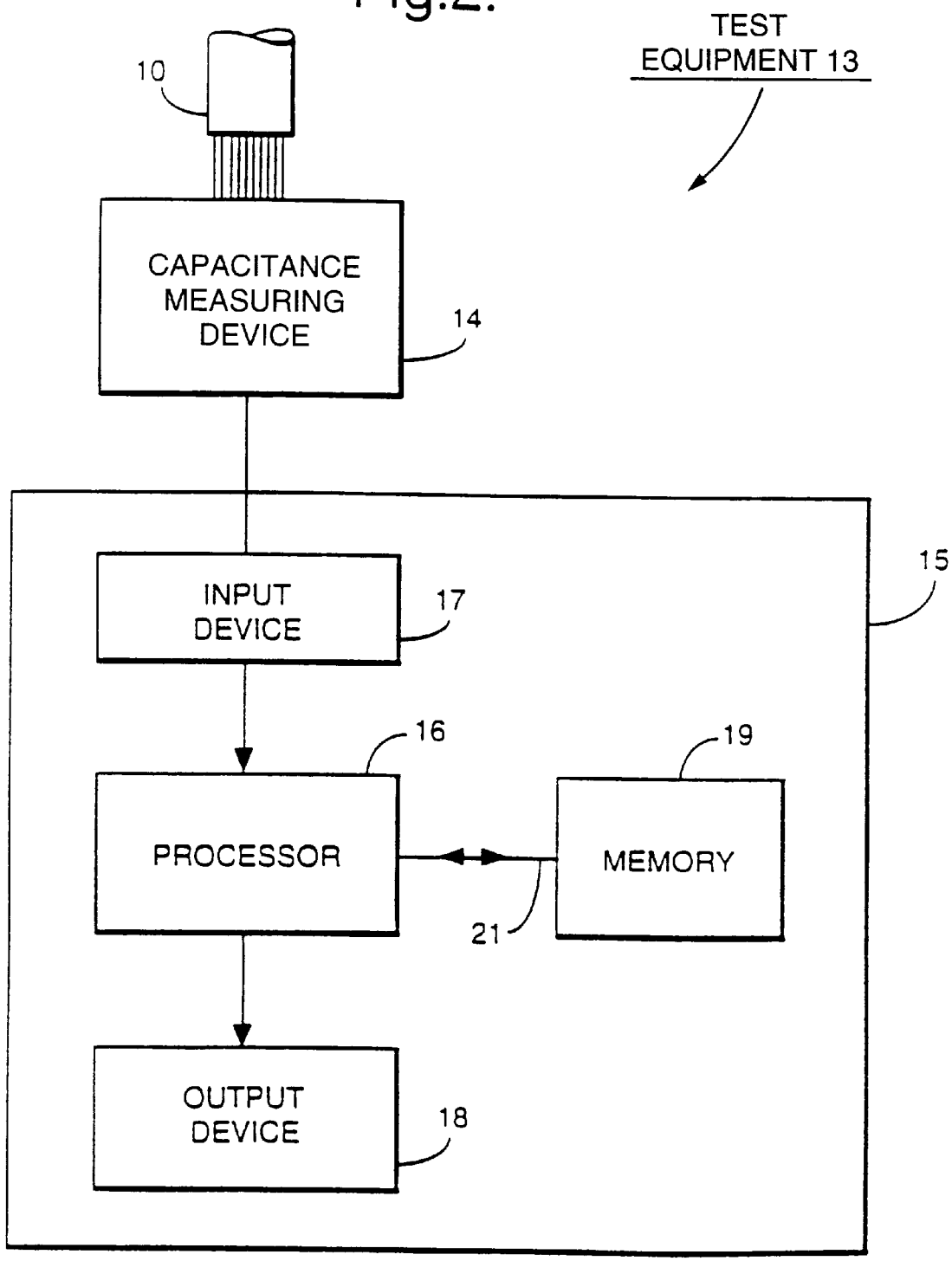
FIG. 2 shows in schematic block diagram form the testing equipment shown in FIG. 1.

FIG. 2 shows in greater detail the test equipment 13 used to detect faults on the wire pairs. This includes a capacitance measuring device 14 connected to the wire pairs that form the cable 10 and a computer 15.

The computer 15 includes a processor 16, an input/output device 17, an output device 18 and memory 19. The input/output device 17 is in this case an input/output port to which the capacitance measuring device 14 passes values of capacitance and from which the capacitance measuring device 14 receives instructions from the processor 16. These values pass to the processor 16 along a databus in a manner well known.

Memory 19 is of a type that can be read and also written to such as Random Access Memory RAM. It holds instructions which can be accessed and acted on by the processor 16. (The instructions are held in accessible memory locations which can be addressed by the processor 16). The processor 16 is also able to store data in the memory by writing the data into a memory location. The 19 may take the form of a hard disc, silicon chips or other memory device. The data flows between the memory 19 and the processor 16 along a databus 21 in a well known manner.

The output device 18 is a device for displaying information generated by the processor 16 and typically could include a Visual Display Unit (VDU) and/or a printer. Alternatively, it may be a device for transmitting the information to another location which accepts and then processes the information from a number of exchanges. The information may then be collated and used to generate instructions for service personnel.

The capacitance measuring device 14 may take any convenient form but it must be capable of monitoring the large number of wire pairs on the cable. One way in which this could be achieved is by including means to sequentially or randomly connect the device to each wire pair.

The instructions for which wire pair to test come from the processor 16 via the input/output device 17 or could be generated by the means to connect the device to each wire pair. If the latter alternative is adopted, capacitance values passed by the capacitance measuring device 14 would have to be accompanied by information identifying the wire pair being tested that is to say the wire pair having that capacitance value. (It may be convenient to do this even if the processor 16 instructs the capacitance measuring device 14 which wire pair to test).

As earlier described, the processor 16 acts in accordance with processor instructions stored in memory locations of memory 19. A more detailed explanation will now be given with reference to an illustrative flowchart of the operation of the testing equipment which is shown in FIG. 3.

A first step 30 in the operation is system initialisation. The next step 31 is for the processor 16 to instruct the capacitance measuring device 14 to measure the capacitance of the first wire pair.

In a step 32, the capacitance measuring device 14 then measures the capacitance C of the wire pair. This value is passed via the input/output device 17 to the processor 16 where it is held in short term memory (not shown).

Figure 3:
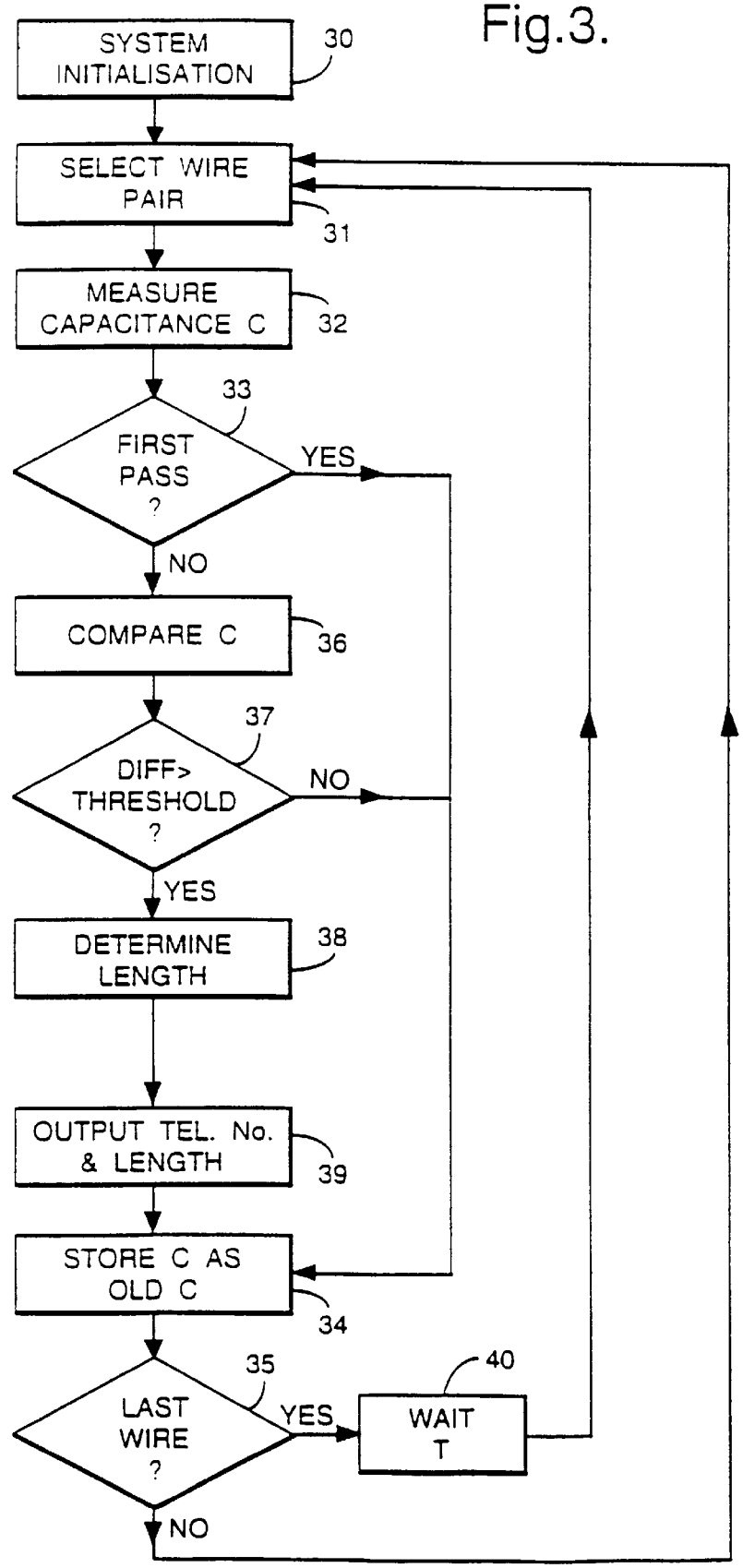
FIG. 3 is a flowchart illustrating the operation of the testing equipment shown in FIG. 1.

In a step 33, the processor 16 then decides whether this is the first pass through the steps shown in FIG. 3. Since it is the first pass, in a step 34 the value of C is stored in memory 19 as old C together with a wire pair identifier.

In a step 35, the processor 16 considers whether that wire pair is the last wire pair. If it is not the last wire pair, then a return is made to step 31 and the next wire pair is selected. The series of steps described above are then repeated.

Thus, after measuring the capacitance C of the last wire pair, the memory 19 will hold wire pair identifiers and associated values of old C for all the selected wire pairs. Then, in a step 40, the processor 16 waits for a time internal T. T may be any time interval but, in this case, it is twenty four hours.

After twenty four hours, a return is made to step 31 and the first wire pair is again selected. Then, in step 32, the capacitance of the first wire pair is measured. Then, in step 33, since this is not the first pass, it is decided that the next step will be step 36. In step 36, the newly measured value of C is compared by the processor 16 with the old C stored in the memory 19 for the same wire pair. The difference of the values is determined that is to say, old C—C.

The difference is then compared in a step with a predetermined threshold value stored in memory 19 in order to determine whether it represents a significant difference. (A significant difference being one which is caused by a fault on the wire pair as opposed to a minor variation perhaps caused by climatic conditions which does not perceivably affect the service experienced by a subscriber).

From the difference, in a step 38 a difference in the length of the wire pair is determined by the processor 16, the wire pair having a known relationship of capacitance per unit length. This difference in the length of the wire is the distance of the fault from the subscribers' terminating equipment.

The processor 16 outputs this data along with a wire identifier such as a telephone number to the output device 19 where it is displayed.

The newly measured value of C is then stored in a step 39 as old C by overwriting the previous old C value. The process is repeated for the next wire pair.

Thus a printout of faulty telephone lines is printed out together with the distance of the fault from the subscriber's terminating equipment.

Service personnel may then be dispatched to rectify the faults.

What is claimed is:

1. A method of testing a telecommunications network for the presence of a fault, said method comprising the steps of:

determining a first capacitance value of a line of the network at a first time;

storing the first capacitance value;

determining a second capacitance value of the line at a second time;

determining from the first and second capacitance values a value for a change in capacitance value;

comparing the change in capacitance value with a threshold value so as to detect the present of a fault; and if the threshold value is exceeded, determining from the change in capacitance value and a known capacitance length ratio a corresponding length of line and hence the distance of the fault from terminating equipment at the end of the line remote from the point of measuring the capacitance values.

2. An apparatus for testing at least one line of a telecommunications network for the presence of a fault, said apparatus comprising:

means for measuring the capacitance value of a line of the network at a first time to obtain a first capacitance value;

means for measuring the capacitance value of said line at a second time to obtain a second value;

means for determining a change in capacitance value from the first and second capacitance values;

mean for comparing said change in capacitance value with a threshold value so as to detect a fault; and means for determining from the change in capacitance value and a known capacitance length ratio a corresponding length of line and hence the distance of the fault from terminating equipment at the end of the line remote from the point of measuring the capacitance values.

3. A method of testing a telecommunications line for the presence and location of a fault with respect to one end of the line remote from the testing location, said method comprising:

detecting the presence of a line fault by detecting a change in line capacitance with respect to time exceeding a predetermined threshold at a test location in a telecommunications network;

determining the approximate location of the fault with respect to an end of the line remote from said test location using a predetermined capacitance to line length ratio and the detected change in line capacitance.

4. Apparatus for testing a telecommunications line for the presence and location of a fault with respect to one end of the line remote from the testing location, said apparatus comprising:

means for detecting the presence of a line fault by detecting a change in line capacitance with respect to time exceeding a predetermined threshold at a test location in a telecommunications network;

means for determining the approximate location of the fault with respect to an end of the line remote from said test location using a predetermined capacitance to line length ratio and the detected change in line capacitance.

* * * * *